(12) United States Patent
Hasegawa et al.

(10) Patent No.: US 11,257,732 B2
(45) Date of Patent: Feb. 22, 2022

(54) SEMICONDUCTOR MODULE AND SEMICONDUCTOR DEVICE

(71) Applicant: Mitsubishi Electric Corporation, Tokyo (JP)

(72) Inventors: Maki Hasegawa, Tokyo (JP); Shuhei Yokoyama, Tokyo (JP); Shogo Shibata, Tokyo (JP); Shigeru Mori, Tokyo (JP); Toru Iwagami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/310,677

(22) PCT Filed: Nov. 15, 2016

(86) PCT No.: PCT/JP2016/083801
§ 371 (c)(1),
(2) Date: Dec. 17, 2018

(87) PCT Pub. No.: WO2018/092185
PCT Pub. Date: May 24, 2018

(65) Prior Publication Data
US 2019/0259681 A1 Aug. 22, 2019

(51) Int. Cl.
*H01L 23/31* (2006.01)
*H01L 23/495* (2006.01)
(Continued)

(52) U.S. Cl.
CPC ...... *H01L 23/3142* (2013.01); *H01L 23/3107* (2013.01); *H01L 23/4334* (2013.01);
(Continued)

(58) Field of Classification Search
CPC .......... H01L 23/49568; H01L 23/4334; H01L 23/34–23/4093; H05K 7/20418; F28F 2215/04
See application file for complete search history.

(56) References Cited

U.S. PATENT DOCUMENTS 5,703,399 A * 12/1997 Majumdar ............ H01L 21/565
257/675
2002/0057553 A1* 5/2002 Jeon ........................ H01L 23/34
361/709
(Continued)

FOREIGN PATENT DOCUMENTS

JP H05-067001 A 9/1993
JP H10-112519 A 4/1998
(Continued)

OTHER PUBLICATIONS

International Search Report issued in PCT/JP2016/083801; dated Feb. 7, 2017.
(Continued)

*Primary Examiner* — John A Bodnar
(74) *Attorney, Agent, or Firm* — Studebaker & Brackett PC

(57) ABSTRACT

A semiconductor module includes: a semiconductor element; a first lead frame including a first portion on which the semiconductor element is mounted; a sealing member sealing the semiconductor element and the first portion; and a heat dissipation member which is integrated with the sealing member and dissipates heat generated in the semiconductor element. The heat dissipation member is insulated from the semiconductor element and the first portion by the sealing member. Therefore, the semiconductor module that is applicable to vertical semiconductor elements and ensures electrical insulation between the semiconductor element and the
(Continued)

heat dissipation member when implementing the semiconductor module onto a circuit board, can be provided.

20 Claims, 7 Drawing Sheets

(51) Int. Cl.
*H01L 23/48* (2006.01)
*H01L 23/433* (2006.01)
*H01L 23/29* (2006.01)

(52) U.S. Cl.
CPC ........ *H01L 23/48* (2013.01); *H01L 23/49537* (2013.01); *H01L 23/49558* (2013.01); *H01L 23/49562* (2013.01); *H01L 23/49568* (2013.01); *H01L 23/49575* (2013.01); *H01L 23/295* (2013.01); *H01L 2224/0603* (2013.01); *H01L 2224/48091* (2013.01); *H01L 2224/48137* (2013.01); *H01L 2224/48247* (2013.01); *H01L 2224/48257* (2013.01); *H01L 2224/73265* (2013.01); *H01L 2924/181* (2013.01)

(56) References Cited

U.S. PATENT DOCUMENTS

| | | | |
|---|---|---|---|
| 2007/0238205 A1 | 10/2007 | Bauer et al. | |
| 2013/0062745 A1* | 3/2013 | Kimura | H01L 23/293 |
| | | | 257/675 |
| 2014/0210093 A1 | 7/2014 | Wang | |
| 2014/0367702 A1* | 12/2014 | Yamamoto | H01L 23/3735 |
| | | | 257/77 |
| 2015/0016064 A1 | 1/2015 | Yamamoto et al. | |
| 2016/0088770 A1* | 3/2016 | Okuaki | H01L 23/367 |
| | | | 165/80.3 |
| 2017/0098598 A1* | 4/2017 | Otremba | H01L 23/4006 |

FOREIGN PATENT DOCUMENTS

| | | |
|---|---|---|
| JP | 2009-532912 A | 9/2009 |
| JP | 2013-070026 A | 4/2013 |
| JP | 2014-143373 A | 8/2014 |
| WO | 2013125474 A1 | 8/2013 |

OTHER PUBLICATIONS

An Office Action mailed by the Chinese Patent Office dated Oct. 12, 2019, which corresponds to Chinese Patent Application No. 201690001801.2 and is related to U.S. Appl. No. 16/310,677.

An Office Action mailed by the Japanese Patent Office dated Feb. 12, 2020, which corresponds to Japanese Patent Application No. 2018-550893 and is related to U.S. Appl. No. 16/310,677; with English language translation.

* cited by examiner

SEMICONDUCTOR MODULE AND SEMICONDUCTOR DEVICE

TECHNICAL FIELD

The present invention relates to a semiconductor module and a semiconductor device.

BACKGROUND ART

A semiconductor module is known which includes a semiconductor element, a heat dissipation member which dissipates heat generated in the semiconductor element, and a sealing member sealing the semiconductor element (see PTL1, PTL2).

CITATION LIST

Patent Literature

PTL 1: Japanese Utility Model Laying-Open No. H5-67001
PTL 2: Japanese Patent Laying-Open No, 2014-143373

SUMMARY OF INVENTION

Technical Problem

However, in the semiconductor module disclosed in PTL 1, the semiconductor element is in contact with the heat dissipation member. Therefore, the semiconductor module disclosed in PTL 1 is not applicable to a vertical semiconductor element that has electrodes on the front and back surfaces of the semiconductor element.

Moreover, in the semiconductor module disclosed in PTL 2, an insulating sheet is disposed between the semiconductor element and the heat dissipation member to electrically insulate the semiconductor element from the heat dissipation member. The insulating sheet is cured or becomes brittle due to heat that is applied thereto when implementing the semiconductor module disclosed in PTL 2 onto a circuit board. For this reason, the insulating sheet is unable to electrically insulate the semiconductor element from the heat dissipation member.

The present invention is made in view of the above problem, and has an object to provide: a semiconductor module that is applicable to vertical semiconductor elements and can ensure electrical insulation between the semiconductor element and the heat dissipation member when implementing the semiconductor module onto the circuit board; and a semiconductor device which includes the semiconductor module.

Solution to Problem

The semiconductor module according to the present invention includes a semiconductor element, a first lead frame including a first portion on which the semiconductor element is mounted, a sealing member sealing at least the semiconductor element and the first portion, and a heat dissipation member which is integrated with the sealing member and dissipates heat generated in the semiconductor element. The heat dissipation member has a heat dissipation surface exposed from the sealing member. The heat dissipation member is insulated from the semiconductor element and the first portion by the sealing member.

The semiconductor device according to the present invention includes the above semiconductor module, a circuit hoard, and a bonding member securing the semiconductor module on the circuit board.

Advantageous Effects of Invention

In the semiconductor module according to the present invention; since the heat dissipation member is insulated from the semiconductor element and the first portion by the sealing member, the semiconductor module is applicable to vertical semiconductor elements. Further, in the semiconductor module according to the present invention, since the heat dissipation member is insulated from the semiconductor element and the first portion by the sealing member, the heat dissipation member is electrically insulated from the semiconductor element and the first portion, without the use of an insulating sheet. Therefore, the electrical insulation between the semiconductor element and the heat dissipation member is ensured when implementing the semiconductor module according to the present invention onto the circuit board.

The semiconductor device according to the present invention includes the above semiconductor module, circuit hoard, and bonding member securing the semiconductor module on the circuit board. Therefore, the semiconductor device is applicable to vertical semiconductor elements, and the electrical insulation between the semiconductor element and the heat dissipation member can be ensured when implementing the semiconductor module onto the circuit board using the bonding member.

DESCRIPTION OF EMBODIMENTS

Figure 1:
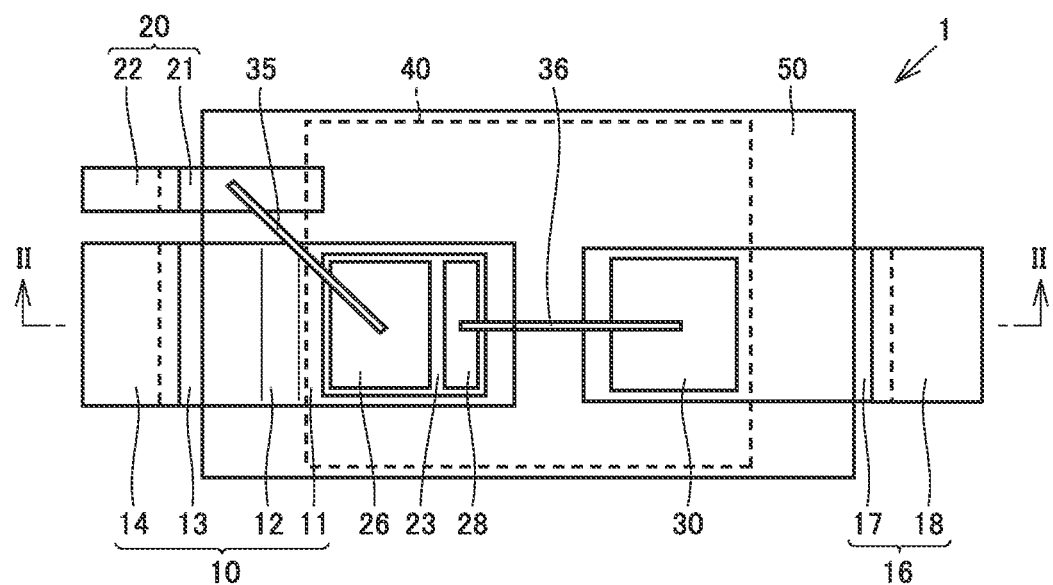
FIG. 1 is a schematic plan view of a semiconductor module according to Embodiment 1 of the present invention.

Hereinafter, embodiments according to the present invention will be described. Note that like reference numeral refers to like configuration, and description will not be repeated.

Embodiment 1

Figure 2:
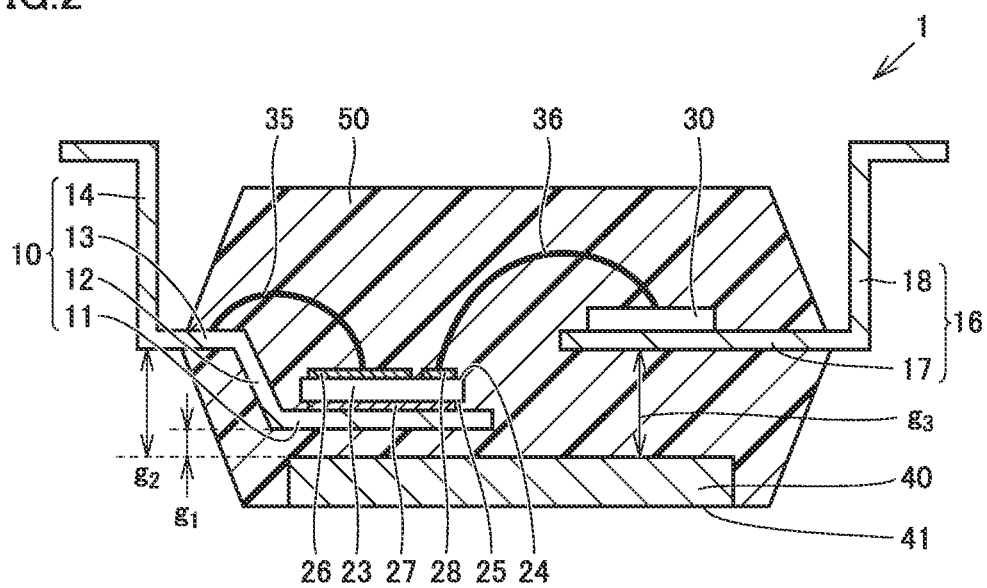
FIG. 2 is a schematic cross-sectional view of the semiconductor module according to Embodiment 1 of the present invention, taken along a section line II-II in FIG. 1.

Referring to FIGS. 1 and 2, a semiconductor module 1 according to Embodiment 1 will be described. Semiconductor module 1 may be a surface-mount type semiconductor module (1). Semiconductor module 1 mainly includes a semiconductor element 23, a first lead frame 10, a sealing member 50, and a heat dissipation member 40. Semiconductor module 1 may further include an integrated circuit 30, a second lead frame 16, a third lead frame 20, a first conductive wire 35, and a second conductive wire 36.

Semiconductor element 23 has a first surface 24 and a second surface 25 opposite the first surface 24. Semiconductor element 23 may be, for example, an insulated gate bipolar transistor (IGBT), metal-oxide semiconductor field-effect transistor (MOSFET), gate turn-off (GTO) thyristor, or diode. Semiconductor element 23 may include a semiconducting material such as silicon (Si), silicon carbide (SiC), or gallium nitride (GaN).

Semiconductor element 23 has multiple electrodes (a first electrode 26, a second electrode 27, a third electrode 28). For example, semiconductor element 23 may be a two-terminal element having two electrodes, or a three-terminal element having three electrodes. Semiconductor element 23 may be a vertical semiconductor element (23). The vertical semiconductor element (23) has electrodes (a first electrode 26, a second electrode 27) on first surface 24 of semiconductor element 23 and second surface 25 opposite the first surface 24. Semiconductor element 23 according to the present embodiment is a vertical three-terminal element which includes first electrode 26 on first surface 24, second electrode 27 on second surface 25, and third electrode 28 on first surface 24, the third electrode 28 being electrically isolated from first electrode 26. Semiconductor element 23 may be, for example, a vertical two-terminal element having first electrode 26 on first surface 24, and second electrode 27 on second surface 25.

Integrated circuit 30 controls semiconductor element 23. Integrated circuit 30 is electrically connected to semiconductor element 23. Specifically, integrated circuit 30 is connected to third electrode 28 of semiconductor element 23 via second conductive wire 36. Second conductive wire 36 is connected to third electrode 28 of semiconductor element 23 and integrated circuit 30. Second conductive wire 36 extends from semiconductor element 23 (third electrode 28) and integrated circuit 30 on the side opposite the heat dissipation member 40 side.

First lead frame 10, second lead frame 16, and third lead frame 20 may include a material that has low electric resistivity and high thermal conductivity, such as copper or aluminum. First lead frame 10, second lead frame 16, and third lead frame 20 are electrically insulated from heat dissipation member 40 by sealing member 50.

First lead frame 10 includes a first portion 11 on which semiconductor element 23 is mounted, and a first terminal portion 14. First lead frame 10 may further include a second portion 12 connected to first portion 11, and a third portion 13 connected to second portion 12 and first terminal portion 14. First portion 11 may be disposed between semiconductor element 23 and heat dissipation member 40. First portion 11 is disposed in spaced apart relation to heat dissipation member 40 by a first gap First gap $g_1$ is defined as the shortest distance between first portion 11 and heat dissipation member 40 in the direction of thickness of heat dissipation member 40. First gap $g_1$ may be 100 μm or greater, and, in particular, 150 μm or greater. First gap $g_1$ may be 500 μm or less, and, in particular, 350 μm or less.

Second portion 12 is tilted relative to first portion 11 and third portion 13 so that first gap $g_1$ between first portion 11 and heat dissipation member 40 is less than a second gap $g_2$ between third portion 13 and heat dissipation member 40, Second gap $g_2$ is defined as the shortest distance between third portion 13 and heat dissipation member 4C) in the direction of thickness of heat dissipation member 40. First lead frame 10, including first portion 11, second portion 12, third portion 13, and first terminal portion 14, may be formed by bending a metal plate.

Semiconductor element 23 is electrically connected to first portion 11 of first lead frame 10. Specifically, semiconductor element 23 may be bonded to first portion 11 of first lead frame 10, using a bonding member (not shown) such as a solder. More specifically, second electrode 27 of semiconductor element 23 may be bonded to first portion 11 of first lead frame 10, using a bonding member (not shown) such as a solder.

First portion 11 and second portion 12 of first lead frame 10 may be embedded in sealing member 50. Therefore, a first bend between first portion 11 and second portion 12 is protected by sealing member 50 from humidity and impact, for example. Further, at least a portion of third portion 13 including the end thereof on the second portion 12 side may be embedded in sealing member 50. Therefore, a second bend between second portion 12 and third portion 13 is protected by sealing member 50 from humidity and impact, for example.

Second lead frame 16 includes a fourth portion 17 on which integrated circuit 30 is mounted, and a second terminal portion 18 connected to fourth portion 17. Second lead frame 16, including fourth portion 17 and second terminal portion 18, may be formed by bending a metal plate. Fourth portion 17 may be disposed between integrated circuit 30 and heat dissipation member 40. First gap $g_1$ between first portion 11 and heat dissipation member 40 may be less than a third gap $g_3$ between fourth portion 17 and heat dissipation member 40. Third gap $g_3$ is defined as the shortest distance between fourth portion 17 and heat dissipation member 40 in the direction of thickness of heat dissipation member 40. Integrated circuit 30 is electrically connected to fourth portion 17 of second lead frame 16. Specifically, integrated circuit 30 may be bonded to fourth portion 17 of second lead frame 16, using a bonding member (not shown) such as a solder.

Third lead frame 20 includes a fifth portion 21, and a third terminal portion 22 connected to fifth portion 21. Third lead frame 20, including fifth portion 21 and third terminal portion 22, may be formed by bending a metal plate. Third lead frame 20 is electrically connected to semiconductor element 23. Specifically, fifth portion 21 of third lead frame 20 is connected to first electrode 26 of semiconductor element 23 via first conductive wire 35. First conductive wire 35 is connected to first electrode 26 of semiconductor element 23 and fifth portion 21 of third lead frame 20. First conductive wire 35 extends from semiconductor element 23 (first electrode 26) and third lead frame 20 (fifth portion 21) on the side opposite the heat dissipation member 40 side.

Sealing member 50 seals at least semiconductor element 23 and first portion 11 of first lead frame 10. Sealing member 50 may further seal second portion 12 of first lead frame 10, at least a portion of third portion 13 of first lead frame 10, integrated circuit 30, at least a portion of fourth portion 17 of second lead frame 16, at least a portion of fifth portion 21 of third lead frame 20, first conductive wire 35, and second conductive wire 36. First terminal portion 14, second terminal portion 18, and third terminal portion 22 are exposed from sealing member 50.

Sealing member 50 is electrically insulating. Sealing member 50 may include, for example, a resin that is electrically insulating and can withstand heat applied thereto when implementing semiconductor module 1 onto circuit board 61 (see FIG. 3). Sealing member 50 may include a resin material selected from among a group consisting of, for example, an epoxy resin, a polyimide resin, a polyamide resin, a polyamideimide resin, a fluorine resin, an isocyanate resin, a silicone resin, and a combination thereof. Sealing member 50 may further include a filler which contains an inorganic material such as silica, alumina, aluminum nitride or boron nitride. Filler may enhance the thermal conductivity of sealing member 50. Therefore, sealing member 50 filled with the filler can effectively transfer the heat, generated from semiconductor element 23, to heat dissipation member 40.

Heat dissipation member 40 dissipates the heat generated in semiconductor element 23. Heat dissipation member 40 is disposed facing first portion 11 of first lead frame 10 and semiconductor element 23. Heat dissipation member 40 may be arranged relative to semiconductor element 23 so that semiconductor element 23 overlaps heat dissipation member 40 in plan view (see FIG. 1) in a direction perpendicular to first surface 24 of semiconductor element 23. Heat dissipation member 40 may further dissipate heat generated in integrated circuit 30. Heat dissipation member 40 is disposed facing fourth portion 17 of second lead frame 16 and integrated circuit 30. Heat dissipation member 40 may be arranged relative to integrated circuit 30 so that integrated circuit 30 overlaps heat dissipation member 40 in plan view (see FIG. 1) in a direction perpendicular to first surface 24 of semiconductor element 23.

Heat dissipation member 40 may be a plate member which includes a material having electrical conductivity and thermal conductivity, such as copper or aluminum. Heat dissipation member 40 has a heat dissipation surface 41 exposed from sealing member 50. Heat dissipation surface 41 being exposed from sealing member 50 allows heat generated in semiconductor element 23 to be effectively dissipated out of semiconductor module 1. Heat dissipation surface 41 may flush with a surface of sealing member 50. Surfaces of heat dissipation member 40, other than heat dissipation surface 41, may be facing sealing member 50. Heat dissipation member 40 is insulated from semiconductor element 23 and first portion 11 by sealing member 50.

Heat dissipation member 40 is integrated with sealing member 50. For example, heat dissipation member 40 may be integrated with sealing member 50 by molding heat dissipation member 40 by sealing member 50, together with semiconductor element 23, integrated circuit 30, first lead frame 10, second lead frame 16, third lead frame 20, first conductive wire 35, and second conductive wire 36. Heat dissipation member 40 may be integrated with sealing member 50 by fitting heat dissipation member 40 into recesses formed in sealing member 50. Heat dissipation member 40 may be integrated with sealing member 50 by attaching heat dissipation member 40 to sealing member 50, using fixing members such as screws.

Figure 3:
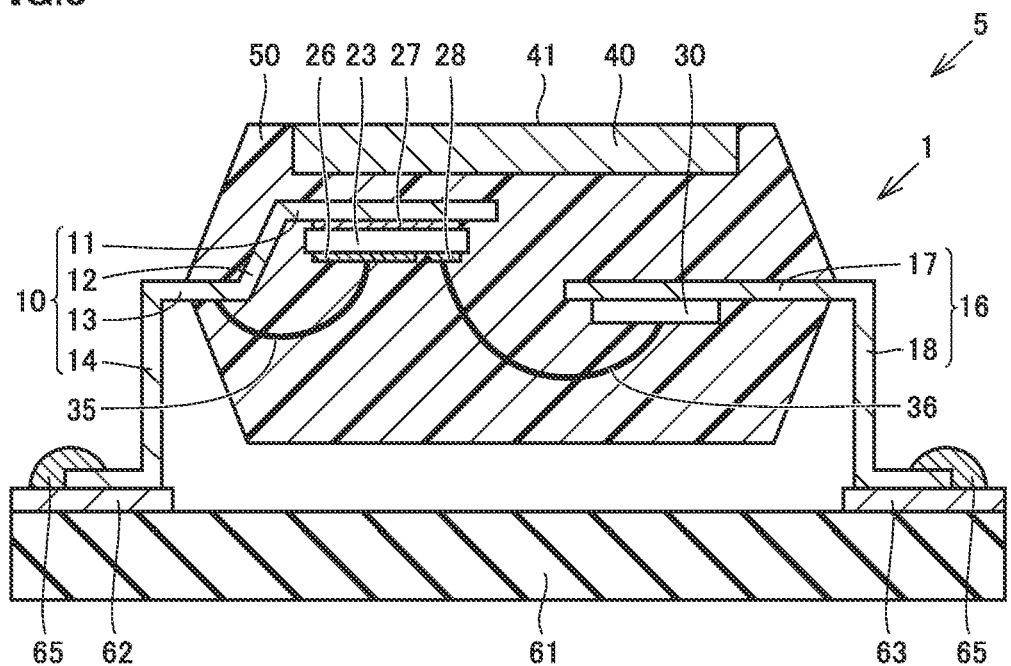
FIG. 3 is a schematic cross-sectional view of a semiconductor device according to Embodiment 1 of the present invention.

Referring to FIG. 3, a semiconductor device 5 according to the present embodiment is described. Semiconductor device 5 includes semiconductor module 1, a circuit board 61 which includes interconnects (a first interconnect 62, a second interconnect 63, and a third interconnect (not shown)), and a bonding member 65 which secures semiconductor module 1 on circuit board 61. First terminal portion 14 of first lead frame 10, second terminal portion 18 of second lead frame 16, and third terminal portion 22 of third lead frame 20 are bonded to first interconnect 62, second interconnect 63, and third interconnect, respectively, of circuit board 61, using bonding member 65. Bonding member 65 may be, for example, a solder. Semiconductor module 1 is implemented onto circuit board 61 using bonding member 65 by applying heat to bonding member 65 (for example, a reflow process when bonding member 65 is a solder). Since sealing member 50 withstands the heat applied thereto in this implementation process, sealing member 50 ensures electrical insulation between semiconductor element 23 and heat dissipation member 40.

Advantageous effects of semiconductor module 1 according to the present embodiment are now described.

Semiconductor module 1 according to the present embodiment includes: semiconductor element 23; first lead frame 10 which includes first portion 11 on which semiconductor element 23 is mounted; sealing member 50 sealing at least semiconductor element 23 and first portion 11; and heat dissipation member 40 which is integrated with sealing member 50 and dissipates the heat generated in semiconductor element 23. Heat dissipation member 40 has the heat dissipation surface 41 exposed from sealing member 50. Heat dissipation member 40 is insulated from semiconductor element 23 and first portion 11 by sealing member 50.

In semiconductor module 1 according to the present embodiment, heat dissipation member 40 is insulated from semiconductor element 23 and first portion 11 by sealing member 50, and heat dissipation member 40 is not in contact with semiconductor element 23 and first portion 11. Therefore, semiconductor module 1 is applicable to the vertical semiconductor element (23). Further, in semiconductor module 1, since heat dissipation member 40 is insulated from semiconductor element 23 and first portion 11 by sealing member 50, heat dissipation member 40 is electrically insulated from semiconductor element 23 and first portion 11, without the use of an insulating sheet. Therefore, the electrical insulation between semiconductor element 23 and heat dissipation member 40 can be ensured when implementing semiconductor module 1 onto circuit board 61.

In the semiconductor module 1 according to the present embodiment, first portion 11 is disposed between semiconductor element 23 and heat dissipation member 40. First portion 11 is disposed in spaced apart relation to heat dissipation member 40 by first gap $g_1$. Therefore, semiconductor module 1 is applicable to the vertical semiconductor element (23), and the electrical insulation between semiconductor element 23 and heat dissipation member 40 can be ensured when implementing semiconductor module 1 onto circuit board 61.

In semiconductor module 1 according to the present embodiment, first gap $g_1$ is 100 μm or greater and 500 μm or less. By configuring first gap $g_1$ to be 100 μm or greater, reliable electrical insulation of heat dissipation member 40 from semiconductor element 23 and first portion 11 can be provided. By configuring first gap $g_1$ to be 500 μm or less, the heat generated from semiconductor element 23 can be transferred to the heat dissipation member 40 through low thermal resistance.

In semiconductor module 1 according to the present embodiment, first lead frame 10 includes second portion 12 connected to first portion 11, third portion 13 connected to second portion 12, and the terminal portion connected to third portion 13. Second portion 12 is tilted relative to first portion 11 and third portion 13 so that first gap $g_1$ between first portion 11 and heat dissipation member 40 is less than second gap $g_2$ between third portion 13 and heat dissipation member 40. Therefore, semiconductor element 23 can be disposed close to heat dissipation member 40, while electrically insulating heat dissipation member 40 from semiconductor element 23 and first portion 11. Heat generated from semiconductor element 23 can be transferred to the heat dissipation member 40 through low thermal resistance.

In semiconductor module 1 according to the present embodiment, first portion 11 and second portion 12 are embedded in sealing member 50. The bend between first portion 11 and second portion 12 can be protected by sealing member 50 from humidity and impact, for example.

Semiconductor module 1 according to the present embodiment further includes integrated circuit 30 electrically connected to semiconductor element 23, and second lead frame 16 including fourth portion 17 on which integrated circuit 30 is mounted. Fourth portion 17 is disposed between integrated circuit 30 and heat dissipation member 40. First gap $g_1$ between first portion 11 and heat dissipation member 40 is less than third gap $g_3$ between fourth portion 17 and heat dissipation member 40. Semiconductor element 23 can be disposed closer to heat dissipation member 40, while electrically insulating heat dissipation member 40 from semiconductor element 23 and first portion 11. Heat generated from semiconductor element 23 can be transferred to heat dissipation member 40 through low thermal resistance.

Semiconductor module 1 according to the present embodiment further includes third lead frame 20, first conductive wire 35 connected to third lead frame 20 and semiconductor element 23, and a second conductive wire 36 connected to integrated circuit 30 and semiconductor element 23. First conductive wire 35 extends from third lead frame 20 and semiconductor element 23 on the side opposite the heat dissipation member 40 side. Second conductive wire 36 extends from integrated circuit 30 and semiconductor element 23 on the side opposite the heat dissipation member 40 side. Third gap $g_3$ between fourth portion 17 and heat dissipation member 40 is different from first gap $g_1$ between first portion 11 and heat dissipation member 40. Therefore, even though first conductive wire 35 and second conductive wire 36 extend from semiconductor element 23 on the side opposite the heat dissipation member 40 side, second conductive wire 36 can readily be bonded to integrated circuit 30 and semiconductor element 23.

In semiconductor module 1 according to the present embodiment, the surfaces of heat dissipation member 40, other than heat dissipation surface 41, are facing sealing member 50. Therefore, heat dissipation member 40 can be firmly integrated with sealing member 50.

In semiconductor module 1 according to the present embodiment, semiconductor element 23 has first surface 24 and second surface 25 opposite the first surface 24. Semiconductor element 23 has first electrode 26 on first surface 24, and second electrode 27 on second surface 25. Second electrode 27 is bonded to first portion 11 of first lead frame 10. Semiconductor module 1 according to the present embodiment is applicable to the vertical semiconductor element (23), and the electrical insulation between semiconductor element 23 and heat dissipation member 40 can be ensured when implementing semiconductor module 1 onto circuit board 61.

Semiconductor device 5 according to the present embodiment includes semiconductor module 1, circuit board 61, and the bonding member securing semiconductor module 1 on circuit board 61. Therefore, semiconductor device 5 is applicable to the vertical semiconductor element (23), and the electrical insulation between semiconductor element 23 and heat dissipation member 40 can be ensured when implementing semiconductor module 1 onto circuit board 61 using the bonding member.

Embodiment 2

Figure 4:
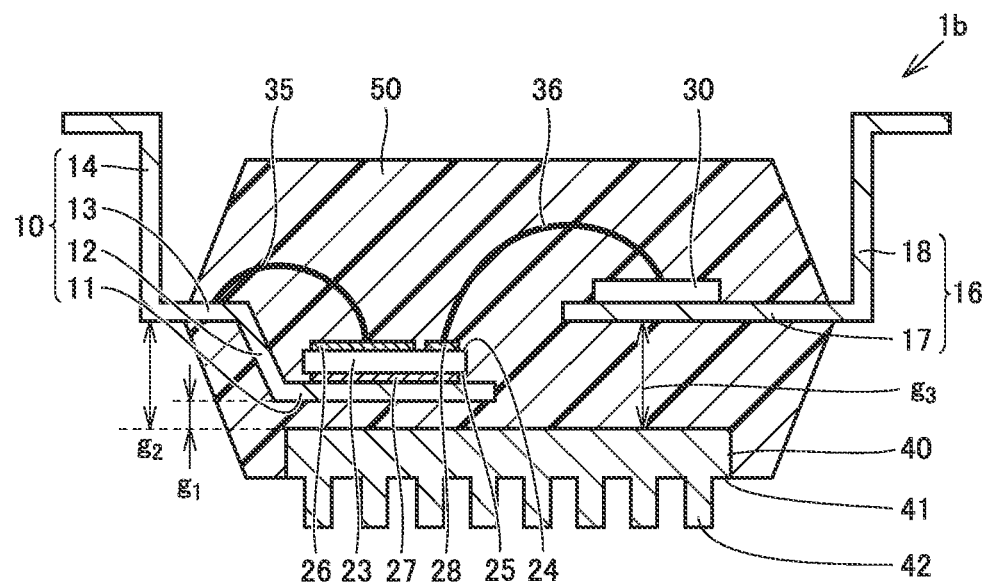
FIG. 4 is a schematic cross-sectional view of a semiconductor module according to Embodiment 2 of the present invention.
Figure 5:
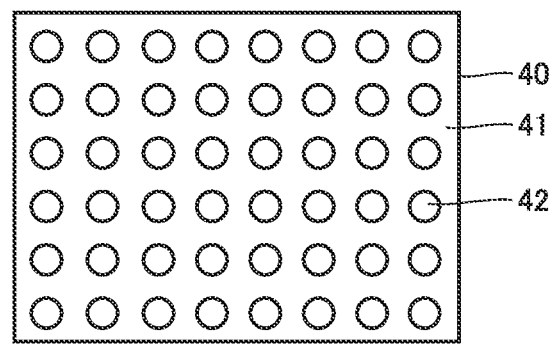
FIG. 5 is a schematic plan view of a heat dissipation member included in the semiconductor module according to Embodiment 2 of the present invention.
Figure 6:
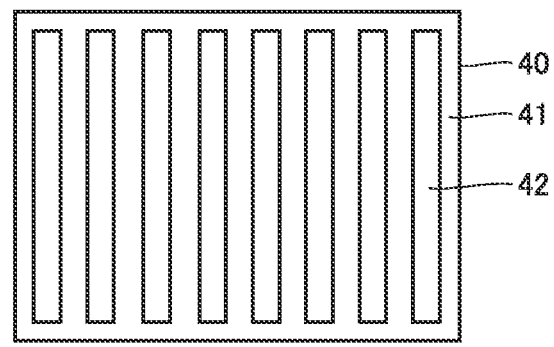
FIG. 6 is a schematic plan view of a heat dissipation member included in the semiconductor module according to Embodiment 2 of the present invention.

Referring to FIGS. 4 to 6, a semiconductor module 1b according to Embodiment 2 is described. Semiconductor module 1b according to the present embodiment basically has the same configuration as semiconductor module 1 according to Embodiment 1. Semiconductor module 1b differs from semiconductor module 1, mainly in the following respects.

Figure 12:
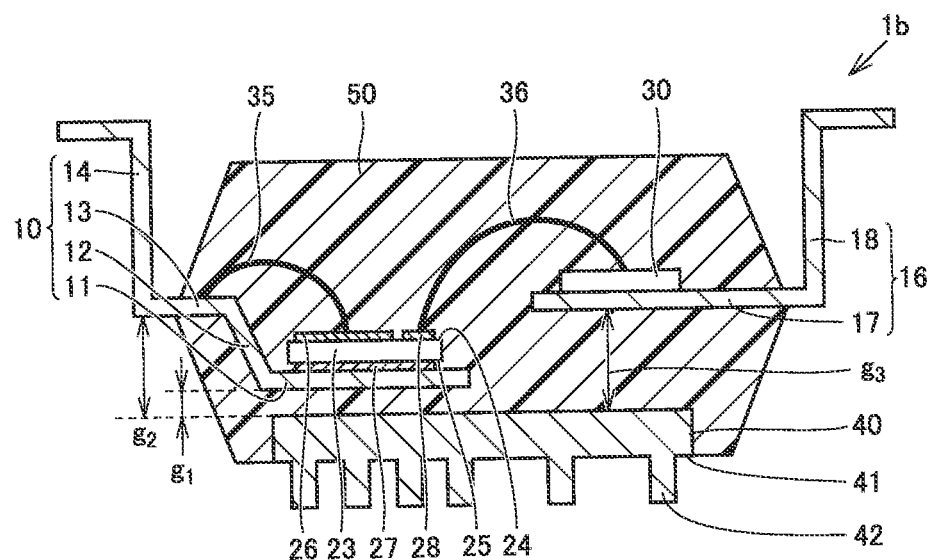
FIG. 12 is a schematic cross-sectional view of a semiconductor module according to a modification of Embodiment 2 of the present invention.

Semiconductor module 1b according to the present embodiment includes a heat dissipation member 40 which includes one or more protrusions 42 on a heat dissipation surface 41. One or more protrusions 42 each may be a columnar protrusion 42 as shown in FIG. 5, or may be a plate-like protrusion 42 as shown in FIG. 6. One or more protrusions 42 may be uniformly distributed within heat dissipation surface 41, or maybe unevenly distributed within heat dissipation surface 41. If a semiconductor element 23 generates an amount of heat greater than an amount of heat generated from an integrated circuit 30, one or more protrusions 42 arranged in a first region, corresponding to semiconductor element 23, of heat dissipation surface 41 may be more than those arranged in a second region, corresponding to integrated circuit 30, of heat dissipation surface 41 as shown in FIG. 12.

A semiconductor device according to the present embodiment has the same configuration as semiconductor device 5 according to Embodiment 1, except that the semiconductor device according to the present embodiment includes semiconductor module 1b according to the present embodiment, instead of semiconductor module 1 according to Embodiment 1.

Advantageous effects of semiconductor module 1b according to the present embodiment are described. Semiconductor module 1b according to the present embodiment yields the following advantageous effects, in addition to those obtained from semiconductor module 1 according to Embodiment 1. In semiconductor module 1b according to the present embodiment, heat dissipation member 40 includes one or more protrusions 42 on heat dissipation surface 41. One or more protrusions 42 increase the heat dissipating area of heat dissipation member 40. Therefore, the heat dissipation characteristics of semiconductor module 1b can be improved.

Embodiment 3

Figure 7:
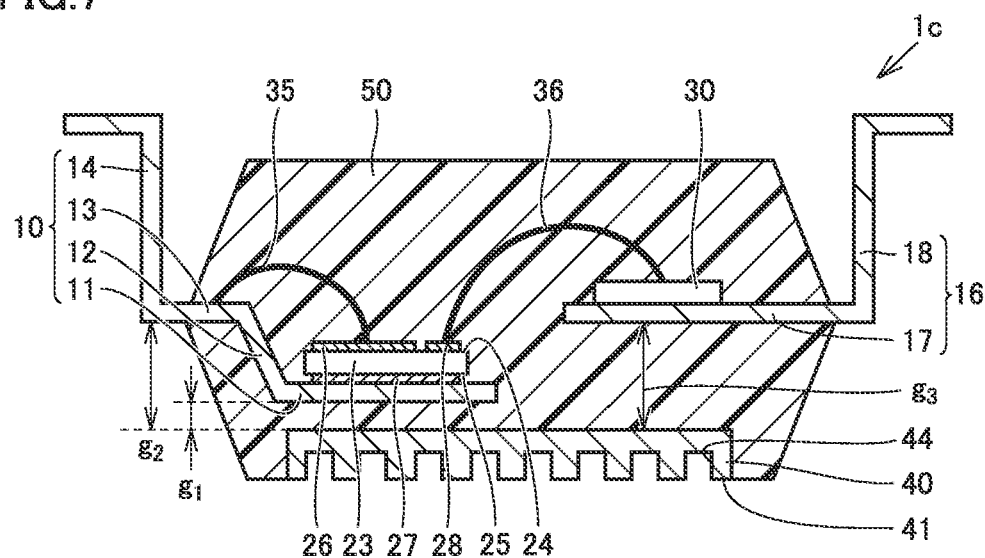
FIG. 7 is a schematic cross-sectional view of a semiconductor module according to Embodiment 3 of the present invention.
Figure 8:
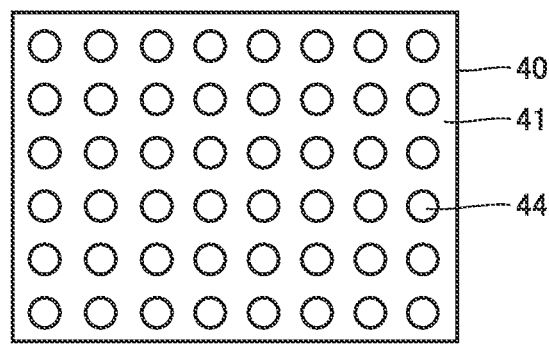
FIG. 8 is a schematic plan view of a heat dissipation member included in the semiconductor module according to Embodiment 3 of the present invention.
Figure 9:
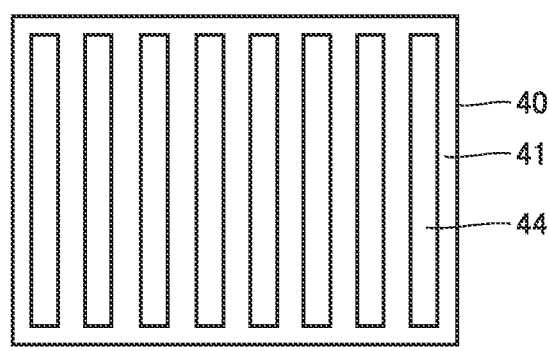
FIG. 9 is a schematic plan view of a heat dissipation member included in the semiconductor module according to Embodiment 3 of the present invention.

Referring to FIGS. 7 to 9, a semiconductor module 1c according to Embodiment 3 is described. Semiconductor module 1c according to the present embodiment basically has the same configuration as semiconductor module 1 according to Embodiment 1. Semiconductor module 1c differs from semiconductor module 1, mainly in the following respects.

Figure 13:
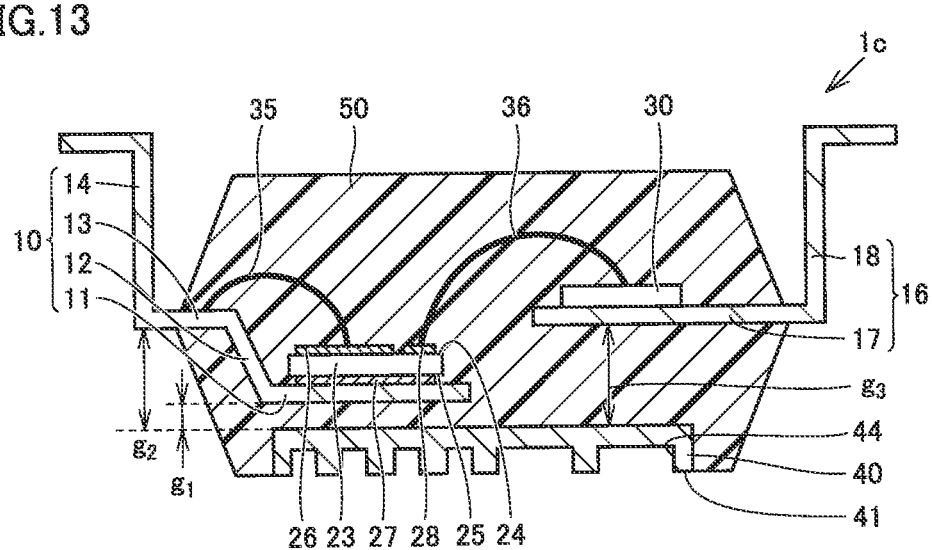
FIG. 13 is a schematic cross-sectional view of a semiconductor module according to a modification of Embodiment 3 of the present invention.

Semiconductor module 1c according to the present embodiment includes a heat dissipation member 40 which includes one or more recesses 44 in a heat dissipation surface 41. One or more recesses 44 each may be a columnar recess 44 as shown in FIG. 8, or may be a plate-like recess 44 as shown in FIG. 9. One or more recesses 44 may be uniformly distributed within heat dissipation surface 41, or may be unevenly distributed within heat dissipation surface 41. If a semiconductor element 23 generates an amount of heat greater than an amount of heat generated from an integrated circuit 30, one or more recesses 44 arranged in a first region, corresponding to semiconductor element 23, of heat dissipation surface 41 may be more than those arranged in a second region, corresponding to integrated circuit 30, of heat dissipation surface 41 as shown in FIG. 13.

A semiconductor device according to the present embodiment has the same configuration as semiconductor device 5 according to Embodiment 1, except that the semiconductor device according to the present embodiment includes semiconductor module 1c according to the present embodiment, instead of semiconductor module 1 according to Embodiment 1.

Advantageous effects of semiconductor module is according to the present embodiment are described. Semiconductor module 1c according to the present embodiment yields the following advantageous effects, in addition to those obtained from semiconductor module 1 according to Embodiment 1. In semiconductor module 1c according to the present embodiment, heat dissipation member 40 includes one or more recesses 44 in heat dissipation surface 41. One or more recesses 44 increase the heat dissipating area of heat dissipation member 40. Therefore, the heat dissipation characteristics of semiconductor module 1c can be improved.

Embodiment 4

Figure 10:
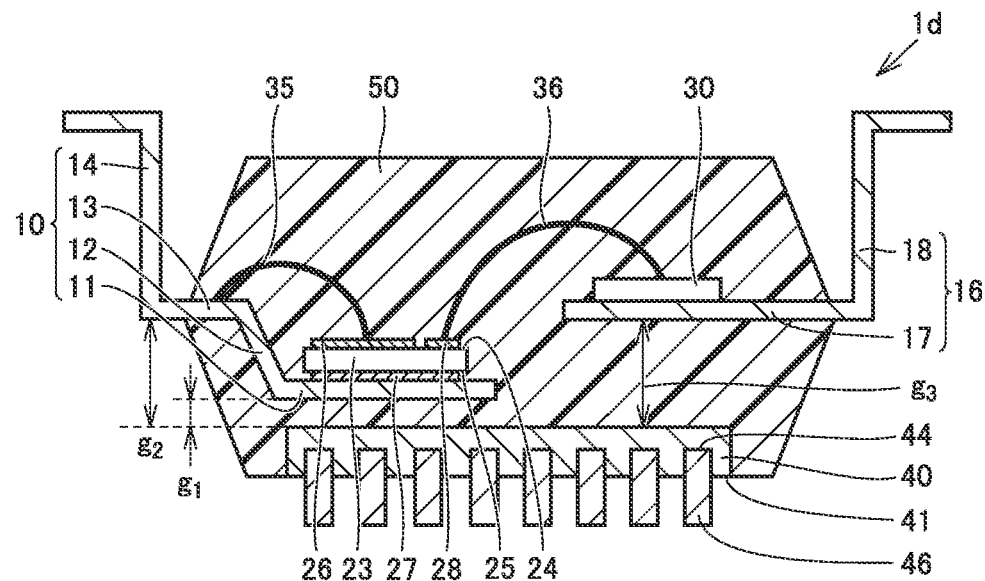
FIG. 10 is a schematic cross-sectional view of a semiconductor module according to Embodiment 4 of the present invention.

Referring to FIG. 10, a semiconductor module 1d according to Embodiment 4 is described. Semiconductor module 1d according to the present embodiment basically has the same configuration as semiconductor module 1b according to Embodiment 2. Semiconductor module 1d differs from semiconductor module 1b, mainly in the following respects.

Semiconductor module 1d according to the present embodiment includes a heat dissipation member 40 which includes: one or more recesses 44 in a heat dissipation surface 41; and one or more protruding members 46 that are coupled to at least some of one or more recesses 44 and projecting from heat dissipation surface 41. One or more protruding members 46 each may be a columnar protruding member 46, and one or more recesses 44 each may be a columnar recess 44. One or more protruding members 46 each may be a plate-like protruding member 46, and one or more recesses 44 each may be a plate-like recess 44. One or more protruding members 46 may be pressed into one or more recesses 44. One or more protruding members 46 may be threadedly engaged with one or more recesses 44.

Figure 14:
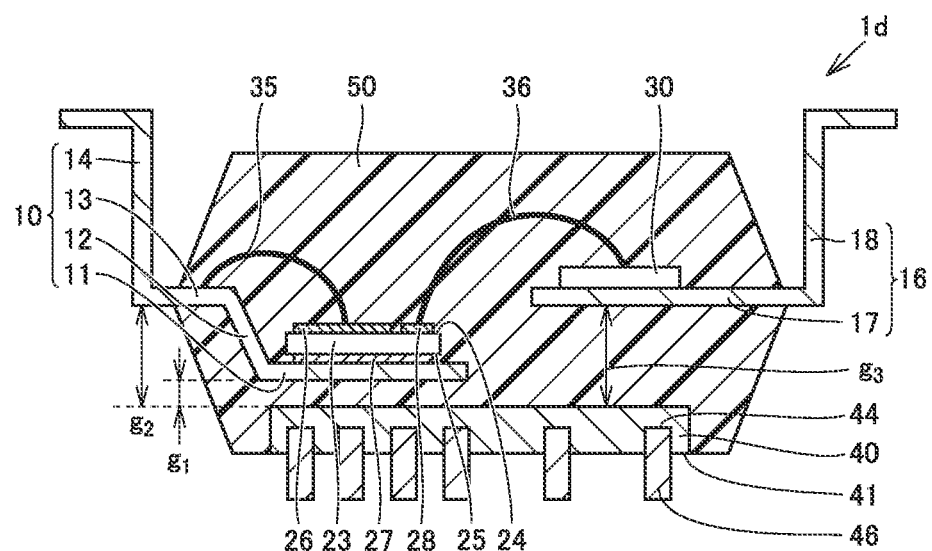
FIG. 14 is a schematic cross-sectional view of a semiconductor module according to a modification of Embodiment 4 of the present invention.

One or more protruding members 46 may be uniformly distributed within heat dissipation surface 41, or may be unevenly distributed within heat dissipation surface 41. If a semiconductor element 23 generates an amount of heat greater than an amount of heat generated from an integrated circuit 30, one or more protruding members 46 arranged in a first region, corresponding to semiconductor element 23, of heat dissipation surface 41 may be more than those arranged in a second region, corresponding to integrated circuit 30, of heat dissipation surface 41 as shown in FIG. 14.

In one example of a method for fabricating semiconductor module 1d according to the present embodiment, heat dissipation member 40 is molded by sealing member 50, together with semiconductor element 23, integrated circuit 30, first lead frame 10, second lead frame 16, third lead frame 20, first conductive wire 35, and second conductive wire 36, and then one or more protruding members 46 may be coupled to one or more recesses 44.

A semiconductor device according to the present embodiment has the same configuration as the semiconductor device according to Embodiment 2, except that the semiconductor device according to the present embodiment includes semiconductor module 1d according to the present embodiment, instead of semiconductor module 1b according to Embodiment 2.

Advantageous effects of semiconductor module 1d according to the present embodiment are described. Semiconductor module 1d according to the present embodiment yields the following advantageous effects, in addition to those obtained from semiconductor module 1b according to Embodiment 2.

Semiconductor module 1d according to the present embodiment includes a heat dissipation member 40 which includes: one or more recesses 44 in a heat dissipation surface 41; and one or more protruding members 46 that are coupled to at least some of one or more recesses 44 and projecting from heat dissipation surface 41. Therefore, the number of one or more protruding members 46 can depend on an amount of heat generated from semiconductor element 23. Semiconductor module 1d according to the present embodiment has heat dissipation characteristics suited for semiconductor element 23, and cost for semiconductor module 1d can be reduced by omitting unnecessary protruding members 46.

Semiconductor module 1d according to the present embodiment is configured so that it can be fabricated by molding heat dissipation member 40 by sealing member 50, together with semiconductor element 23, integrated circuit 30, first lead frame 10, second lead frame 16, third lead frame 20, first conductive wire 35, and second conductive wire 36, and then coupling one or more protruding members 46 to one or more recesses 44. Semiconductor module 1d according to the present embodiment is configured so that it can be fabricated using the same mold as the mold used for the molding process for semiconductor module 1 according to Embodiment 1. Therefore, the cost for semiconductor module 1d can be reduced.

Embodiment 5

Figure 11:
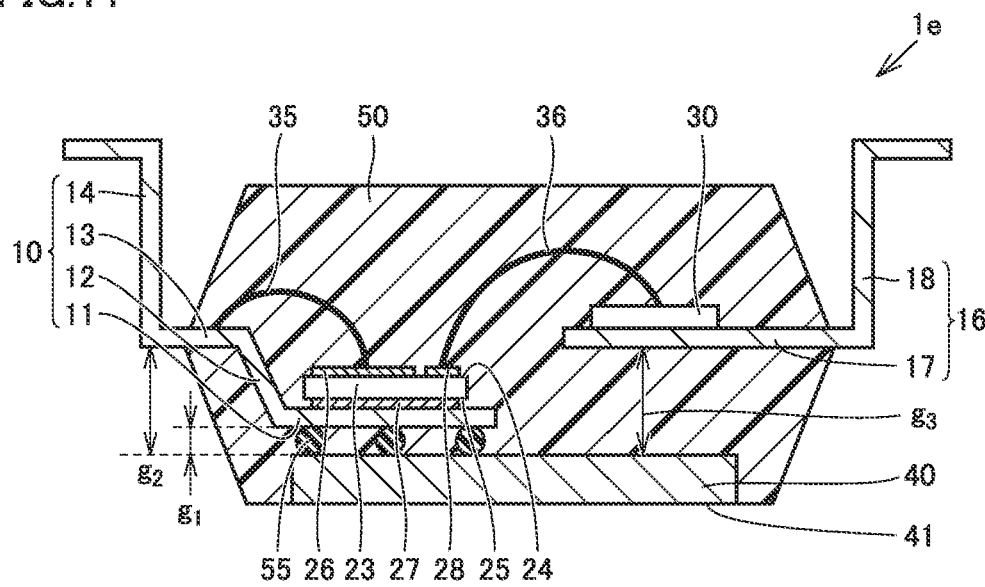
FIG. 11 is a schematic cross-sectional view of a semiconductor module according to Embodiment 5 of the present invention.

Referring to FIG. 11, a semiconductor module 1e according to Embodiment 5 is described. Semiconductor module 1e according to the present embodiment basically has the same configuration as semiconductor module 1 according to Embodiment 1. Semiconductor module 1e differs from semiconductor module 1, mainly in the following respects.

Semiconductor module 1e according to the present embodiment further includes an insulating spacer 55 between a first portion 11 and a heat dissipation member 40. Insulating spacer 55 defines a first gap $g_1$ between first portion 11 and heat dissipation member 40. Insulating spacer 55 may be adhered to first portion 11 and heat dissipation member 40.

In one example of a method for fabricating semiconductor module 1e according to the present embodiment, insulating spacer 55 is disposed between first portion 11 and heat dissipation member 40, and then semiconductor element 23, first lead frame 10, and heat dissipation member 40 are molded by the sealing resin. Owing to insulating spacer 55, electrical insulation between semiconductor element 23 and heat dissipation member 40 can stably be ensured in this molding process.

A semiconductor device according to the present embodiment has the same configuration as semiconductor device 5 according to Embodiment 1, except that the semiconductor device according to the present embodiment includes semiconductor module 1e according to the present embodiment, instead of semiconductor module 1 according to Embodiment 1.

Advantageous effects of semiconductor module 1e according to the present embodiment are described. Semiconductor module 1e according to the present embodiment yields the following advantageous effects, in addition to those obtained from semiconductor module 1 according to Embodiment 1. Semiconductor module 1e according to the present embodiment further includes insulating spacer 55 between first portion 11 and heat dissipation member 40. Insulating spacer 55 defines first gap $g_1$ between first portion 11 and heat dissipation member 40. Therefore, the electrical its insulation between semiconductor element 23 and heat dissipation member 40 can stably be ensured.

The embodiments presently disclosed are to be considered in all aspects as illustrative and not restrictive. Unless otherwise indicated herein or clearly contradicted by context, at least two of Embodiments 1 through 5 presently disclosed may be combined. The scope of the present invention is determined by the appended claims, rather than by the foregoing description, and all changes which conic within the meaning and range of equivalency of the appended claims are therefore intended to be embraced therein.

REFERENCE SIGNS LIST 1, 1b, 1c, 1d, 1e semiconductor module; 5 semiconductor device; 10 first lead frame; 11 first portion; 12 second portion; 13 third portion; 14 first terminal portion; 16 second lead frame; 17 fourth portion; 18 second terminal portion; 20 third lead frame; 21 fifth portion; 22 third terminal portion; 23 semiconductor element; 24 first surface; 25 second surface; 26 first electrode; 27 second electrode; 28 third electrode; 30 integrated circuit; 35 first conductive wire; 36 second conductive wire; 40 heat dissipation member; 41 heat dissipation surface; 42 protrusion; 44 recess; 46 protruding member; 50 sealing member; 55 insulating spacer; 61 circuit board; 62 first interconnect; 63 second interconnect; 65 bonding member.

The invention claimed is:

1. A semiconductor module comprising:
a semiconductor element;
an integrated circuit that is electrically connected to the semiconductor element;
a first lead frame including a first portion on which the semiconductor element is mounted;
a second lead frame including a fourth portion on which the integrated circuit is mounted;
a sealing member sealing at least the semiconductor element, the first portion, the integrated circuit and the fourth portion; and
a heat dissipation member which is integrated with the sealing member and configured to dissipate heat generated in the semiconductor element and the integrated circuit,
the heat dissipation member facing the semiconductor element and the integrated circuit,
the heat dissipation member having a heat dissipation surface exposed from and being coplanar with the sealing member,
the heat dissipation member being insulated from the semiconductor element, the first portion, the integrated circuit and the fourth portion by the sealing member,
the semiconductor element configured to generate a first amount of heat greater than a second amount of heat generated from the integrated circuit,
the heat dissipation member including recesses in the heat dissipation surface, and
a first number of recesses extending into the heat dissipation surface which are overlapped by the semiconductor element when viewed in plan view, being more than a second number of recesses in the heat dissipation surface which are overlapped by the integrated circuit when viewed in plan view.

2. The semiconductor module according to claim 1, further comprising an insulating spacer between the first portion and the heat dissipation member.

3. The semiconductor module according to claim 1, wherein
a plurality of surfaces of the heat dissipation member, not including the heat dissipation surface, are facing the sealing member.

4. The semiconductor module according to claim 1, wherein
the semiconductor element has a first surface and a second surface opposite the first surface,
the semiconductor element has a first electrode on the first surface, and a second electrode on the second surface, and
the second electrode is bonded to the first portion of the first lead frame.

5. A semiconductor device comprising
the semiconductor module according to claim 1;
a circuit board; and
a bonding member securing the semiconductor module on the circuit board.

6. The semiconductor module according to claim 1, wherein
the first portion is disposed between the semiconductor element and the heat dissipation member, and
the first portion is disposed in spaced apart relation to the heat dissipation member by a first gap.

7. The semiconductor module according to claim 6, wherein
the first gap is 100 μm or greater and 500 μm or less.

8. The semiconductor module according to claim 6, wherein
the first lead frame includes a second portion connected to the first portion, a third portion connected to the second portion, and a terminal portion connected to the third portion, and
the second portion is tilted relative to the first portion and the third portion so that the first gap between the first portion and the heat dissipation member is less than a second gap between the third portion and the heat dissipation member.

9. The semiconductor module according to claim 8, wherein
the first portion and the second portion are embedded in the sealing member.

10. The semiconductor module according to claim 6, wherein,
the fourth portion is disposed between the integrated circuit and the heat dissipation member, and
the first gap between the first portion and the heat dissipation member is less than a third gap between the fourth portion and the heat dissipation member.

11. The semiconductor module according to claim 10, further comprising:
a third lead frame;
a first conductive wire connected to the third lead frame and the semiconductor element; and
a second conductive wire connected to the integrated circuit and the semiconductor element, wherein
the first conductive wire extends from the third lead frame and the semiconductor element on a side opposite a heat dissipation member side, and
the second conductive wire extends from the integrated circuit and the semiconductor element on the side opposite the heat dissipation member side.

12. A semiconductor module comprising:
a semiconductor element;
an integrated circuit electrically connected to the semiconductor element;
a first lead frame including a first portion on which the semiconductor element is mounted;
a second lead frame including a fourth portion on which the integrated circuit is mounted;
a sealing member sealing at least the semiconductor element, the first portion, the integrated circuit and the fourth portion; and
a heat dissipation member which is integrated with the sealing member and configured to dissipate heat generated in the semiconductor element and the integrated circuit,
the heat dissipation member facing the semiconductor element and the integrated circuit,
the heat dissipation member having a heat dissipation surface exposed from the sealing member,
the heat dissipation member being insulated from the semiconductor element, the first portion, the integrated circuit and the fourth portion by the sealing member,
the semiconductor element configured to generate a first amount of heat greater than a second amount of heat generated from the integrated circuit,
the heat dissipation member including recesses in the heat dissipation surface and protruding members that are threadedly engaged to the recesses, such that all of the protruding members are coupled to a recess, and where all of the protruding members project from the heat dissipation surface, and
a first number of protruding members in the heat dissipation surface which are overlapped by the semiconductor element when viewed in plan view, being more than a second number of protruding members in the heat dissipation surface which are overlapped by the integrated circuit when viewed in plan view.

13. A semiconductor device comprising
the semiconductor module according to claim 12;
a circuit board; and
a bonding member securing the semiconductor module on the circuit board.

14. A semiconductor module comprising:
a semiconductor element;
an integrated circuit that is electrically connected to the semiconductor element;
a first lead frame including a first portion on which the semiconductor element is mounted;
a second lead frame including a fourth portion on which the integrated circuit is mounted;
a sealing member sealing at least the semiconductor element, the first portion, the integrated circuit and the fourth portion; and
a heat dissipation member which is integrated with the sealing member and configured to dissipate heat generated in the semiconductor element and the integrated circuit,
the heat dissipation member facing the semiconductor element and the integrated circuit,
the heat dissipation member having a heat dissipation surface exposed from the sealing member,
the heat dissipation member being insulated from the semiconductor element, the first portion, the integrated circuit and the fourth portion by the sealing member,
the semiconductor element configured to generate a first amount of heat greater than a second amount of heat generated from the integrated circuit,
the heat dissipation member including protrusions formed integrally on the heat dissipation surface, and
a first number of protrusions in the heat dissipation surface which are overlapped by the semiconductor element when viewed in plan view being more than a second number of protrusions in the heat dissipation surface which are overlapped by the integrated circuit when viewed in plan view,
wherein the protrusions are cylindrical.

15. The semiconductor module according to claim 14, further comprising an insulating spacer between the first portion and the heat dissipation member.

16. The semiconductor module according to claim 14, wherein
a plurality of surfaces of the heat dissipation member, not including the heat dissipation surface, are facing the sealing member.

17. The semiconductor module according to claim 14, wherein
the semiconductor element has a first surface and a second surface opposite the first surface,
the semiconductor element has a first electrode on the first surface, and a second electrode on the second surface, and
the second electrode is bonded to the first portion of the first lead frame.

18. The semiconductor module according to claim 14, wherein
the first portion is disposed between the semiconductor element and the heat dissipation member, and the first portion is disposed in spaced apart relation to the heat dissipation member by a first gap.

19. The semiconductor module according to claim 18, wherein the fourth portion is disposed between the integrated circuit and the heat dissipation member, and the first gap between the first portion and the heat dissipation member is less than a third gap between the fourth portion and the heat dissipation member.

20. A semiconductor device comprising the semiconductor module according to claim 14;

a circuit board; and a bonding member securing the semiconductor module on the circuit board.

* * * * *